United States Patent
Lehr et al.

(10) Patent No.: US 6,539,036 B2
(45) Date of Patent: Mar. 25, 2003

(54) LASER CONTROL LOOP WITH AUTOMATIC ADAPTATION TO THE MONITORING SIGNAL POLARITY

(75) Inventors: Steffen Lehr, Villingen-Schwenningen (DE); Rüdiger Brunheim, Unterkirman (DE)

(73) Assignee: Thomson Licensing S.A., Boulogne (FR)

( * ) Notice: Subject to any disclaimer, the term of this patent is extended or adjusted under 35 U.S.C. 154(b) by 157 days.

(21) Appl. No.: 09/739,197

(22) Filed: Dec. 18, 2000

(65) Prior Publication Data

US 2001/0004367 A1 Jun. 21, 2001

(30) Foreign Application Priority Data

Dec. 20, 1999 (DE) .......................................... 199 61 056

(51) Int. Cl.$^7$ ................................................. H01S 3/13
(52) U.S. Cl. ........................... 372/29.016; 372/29.021; 372/29.023; 372/38.02
(58) Field of Search ........................ 372/29.016, 29.021, 372/31, 38.01, 38.02, 29.023, 205, 33

(56) References Cited

U.S. PATENT DOCUMENTS

| | | | |
|---|---|---|---|
| 4,713,819 A | | 12/1987 | Yoshikawa ....................... 372/9 |
| 4,733,398 A | * | 3/1988 | Shibagaki et al. ........ 372/38.02 |
| 4,748,632 A | * | 5/1988 | Preston .................. 372/29.023 |
| 5,040,163 A | * | 8/1991 | Sasaki et al. ................. 250/205 |
| 5,142,544 A | * | 8/1992 | Donahue et al. ......... 372/38.04 |
| 5,355,082 A | | 10/1994 | Schreiber et al. ............ 324/768 |
| 5,881,081 A | | 3/1999 | Hwang ......................... 372/38 |
| 5,884,605 A | | 3/1999 | Nagaishi et al. .......... 123/339.1 |

FOREIGN PATENT DOCUMENTS

| | | | |
|---|---|---|---|
| DE | 3617588 | 12/1986 | ........... H01L/31/00 |
| DE | 4010054 A1 | 10/1991 | ........... H01S/3/133 |
| EP | 0927888 A1 | 7/1999 | ........... G01R/31/28 |
| EP | 0928971 A1 | 7/1999 | ........... G01R/31/28 |

* cited by examiner

Primary Examiner—Albert W. Paladini
(74) Attorney, Agent, or Firm—Joseph S. Tripoli; Paul P. Kiel (57) ABSTRACT

The invention relates to a method and a circuit arrangement for a laser control loop with automatic adaptation to the monitoring signal polarity. Use is made of a single-phase method which consists in that a signal produced by the monitor during the starting phase of the laser control loop is compared with a reference value, and in accordance with the result of the comparison the signal produced by the monitor is fed directly or inverted to the comparator for controlling the light power of the laser during the starting phase of the laser control loop. A signal is produced which initially feeds the comparator for controlling the light power the inverted monitoring signal, or directly feeds the monitoring signal, in a fashion always independent of the monitoring signal polarity, but dependent on the polarity of a reference value, and feeds it in a non-inverted fashion in the case of a monitoring signal running up to the reference value. The laser control loop circuit according to the invention ensures that the monitoring signal is fed with a fixed polarity to the first comparator before the reference value for controlling the light power is reached. This is achieved by virtue of the fact that the monitoring signal is fed to a comparator which compares the monitoring signal with a reference value which is smaller than the reference value for controlling the light power. In the case of a monitoring signal not running up to the first reference value, the comparator for controlling the light power still continues to be fed the inverted monitoring signal. The laser control loop is provided, for example, for controlling the light power of a laser in optical scanning systems for recording or reproducing information independently of the monitoring signal polarity and/or the polarity of the monitor diode of the laser.

10 Claims, 8 Drawing Sheets

LASER CONTROL LOOP WITH AUTOMATIC ADAPTATION TO THE MONITORING SIGNAL POLARITY

FIELD OF THE INVENTION

The invention relates to a method and a circuit arrangement for a laser control loop with automatic adaptation to the monitoring signal polarity. The laser control loop is provided, for example, for controlling the light power of a laser in optical scanning systems for recording or reproducing information independently of the monitoring signal polarity and/or the polarity of the monitor diode of the laser.

BACKGROUND OF THE INVENTION

It is generally known to control the light power of a light source or a laser by feeding a portion of the emitted light power to a so-called monitor diode. The light power or light intensity is measured for this purpose with the aid of a photodetector or the so-called monitor, which is formed as a rule by a photodiode or a phototransistor or a photodetector circuit, and compared with a reference value, and the light power is controlled in accordance with the result of the comparison. Numerous photodetectors are already known which differ in their design and with respect to the output signals provided by them such as, for example, the polarity of the voltage produced, or in their current direction. In order to be able to exchange the laser or the light source in a unit independently of the polarity of the monitor diode or of the photodetector, in order to be able to avoid damage to the unit or to react flexibly to changes in the market with regard to price and availability, there is a need for a method and a circuit arrangement for adapting to the monitoring signal polarity. As a rule, the laser and monitor diode form a unit which can be replaced by another one.

In order to determine the polarity of a monitor diode coupled to a laser, it is already known to apply a voltage to the monitor diode and to determine the polarity or reverse or forward direction of the monitor diode. In order to control the light power, it is necessary to provide a circuit which includes a comparator with a connected reference voltage source which is then fed the monitor diode signal in a second step directly or via an inverter in a fashion corresponding to the polarity of the monitor diode. The light source or the laser is connected via a driver at the circuit.

A method and a circuit arrangement in accordance with EP 0 928 971 A1 are already known for automatically adapting a circuit arrangement to the polarity of the monitor diode. The known method requires two phases and consists in detecting the monitor diode polarity by measurement in a first phase and subsequent activation of the laser control. This leads to a disadvantageous delay in switching on the light source and requires a high outlay on circuitry.

BRIEF SUMMARY OF THE INVENTION

It is the object of the invention to create a method and a circuit arrangement for a laser control loop with automatic adaptation to the monitoring signal polarity which permit the light source or the laser to be switched on without a time delay and permit automatic adaptation to the monitoring signal polarity during the starting phase of the laser control loop with a low outlay.

This object is achieved with the aid of the features specified in the main claims. Advantageous refinements and developments are specified in subclaims.

It is an aspect of the invention to reduce the disadvantageous delay and the outlay of known methods for a laser control loop with detection of the polarity of monitor diodes.

Use is made for this purpose of a method which consists in that a signal produced by the monitor during the starting phase of the laser control loop is compared with a reference value, and in accordance with the result of the comparison the signal produced by the monitor is fed directly or inverted to the comparator for controlling the light power of the laser during the starting phase of the laser control loop. The starting phase of the laser control loop is defined as the period from the application of the supply voltage to the driver of the laser up to when the value is first reached at which the light power of the laser is to be controlled. The automatic adaptation of the laser control loop to the monitoring signal polarity is carried out during the starting phase of the laser control loop. For this purpose, a monitoring signal produced during the starting phase of the laser control loop is compared with a second reference value in a second comparator, and the monitoring signal is fed directly or inverted in accordance with the result of the comparison to the first comparator for controlling the light power of the laser in a fashion independent of the monitoring signal polarity. The second comparator produces a signal which initially feeds the first comparator the monitoring signal in a fashion independent of the monitoring signal polarity as a function of the selected polarity of the second reference value, always doing so in an inverted fashion or directly. In the case of a monitoring signal which does not run up to the first reference value, the signal path is then still switched over within the starting phase of the laser control loop, and the monitoring signal is fed to the first comparator in an inverted fashion. In accordance with the polarity of the second reference value, at the beginning of the starting phase it is the direct or inverted feeding of the monitoring signal to the first comparator which dominates. By comparison with the first reference value for controlling light power, a smaller second reference value is used for the second comparator.

The laser control loop with automatic adaptation to the monitoring signal polarity includes a first comparator which compares the monitoring signal with a first reference value in a known way in order to control the light power. The monitoring signal raises the polarity of the monitor signal correspondingly in a positive or negative direction in a fashion proportional to the laser diode current or to the light power produced by the laser. The laser control loop circuit according to the invention, which has a second comparator, ensures that the monitoring signal is still fed to the first comparator before the first reference value is reached with a fixed direction and/or polarity. This direction is independent of the initial direction of the monitoring signal during the starting phase of the laser current, and is then selected in the direction running up to the first reference value. Running up to a reference value means that the distance from the reference value reduces with advancing time. This is achieved by virtue of the fact that the monitoring signal is fed to a second comparator, which compares the monitoring signal with a second reference value which is smaller than the first reference value. The second comparator produces a signal which ensures that the monitoring signal is fed to the first comparator independently of the polarity of the monitoring signal with a polarity which accords with the actual polarity of the first reference value. The actual polarity of the first reference value means the polarity which is used for comparison with the monitoring signal. Thus, the second comparator produces a signal which ensures that the polarity of the signal representing as actual value the system deviation accords with the polarity which the command variable or the first reference value has at the location at which the comparison is carried out. The monitoring signal is inverted to reverse the polarity of the monitoring signal, and the second comparator is used to produce a signal in such a way that, in accordance with the polarity of the monitoring signal, the monitoring signal is fed to the first comparator with its original polarity or in an inverted fashion. A comparator which is connected at the monitor is provided in order to detect the monitoring signal polarity during the starting phase of the laser control loop. The output of this comparator is connected to the control input of a changeover switch which connects the first comparator to the monitor via an inverter or directly. The second comparator is preferably formed by a difference amplifier or a current mirror connected to a reference current source, and the changeover switch is preferably an electronic switch. As a result, a laser control loop is created with low outlay which has automatic adaptation without time delay to the monitoring signal polarity during the starting phase of the laser control loop. The method and the circuit arrangement for carrying out the method can basically be applied in all light power control loops with automatic monitoring signal detection. The advantages consist, in particular, in that the circuit for controlling the light power requires no external connecting point for switching on or bypassing the inverter, and wrongly connecting up the circuit or connecting a nonsuitable monitor diode are ruled out. The full automation rules out faults caused by human error. The method is denoted as a single-phase method, since the switching-on phase of the laser control loop is not delayed by a preceding method for detecting the polarity of the monitoring signal. The invention is explained below in more detail with the aid of exemplary embodiments.

DETAILED DESCRIPTION OF THE INVENTION

Figure 1:
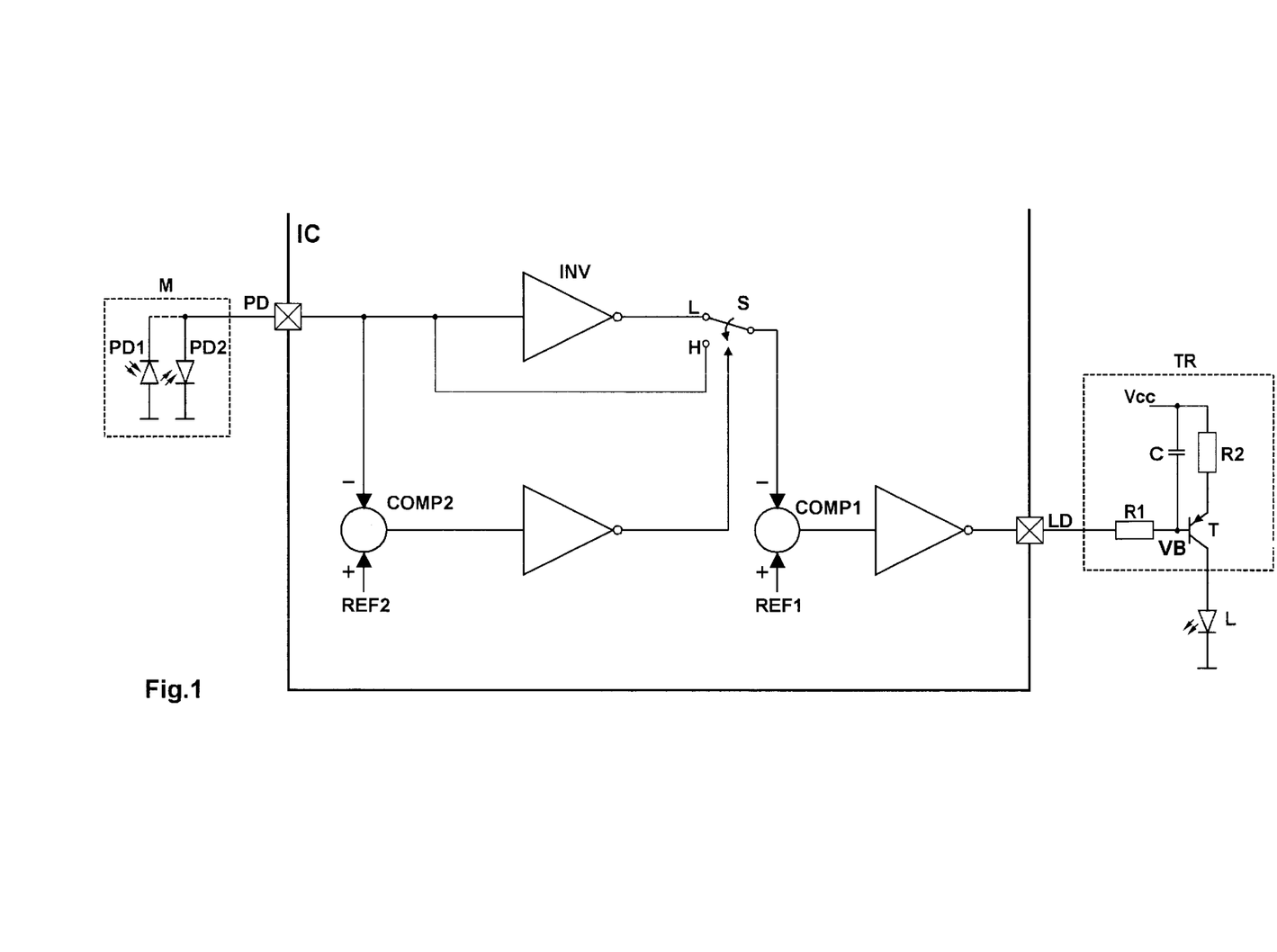
FIG. 1 shows a block diagram of a light power control loop with automatic adaptation to the monitoring signal polarity.
Figure 2:
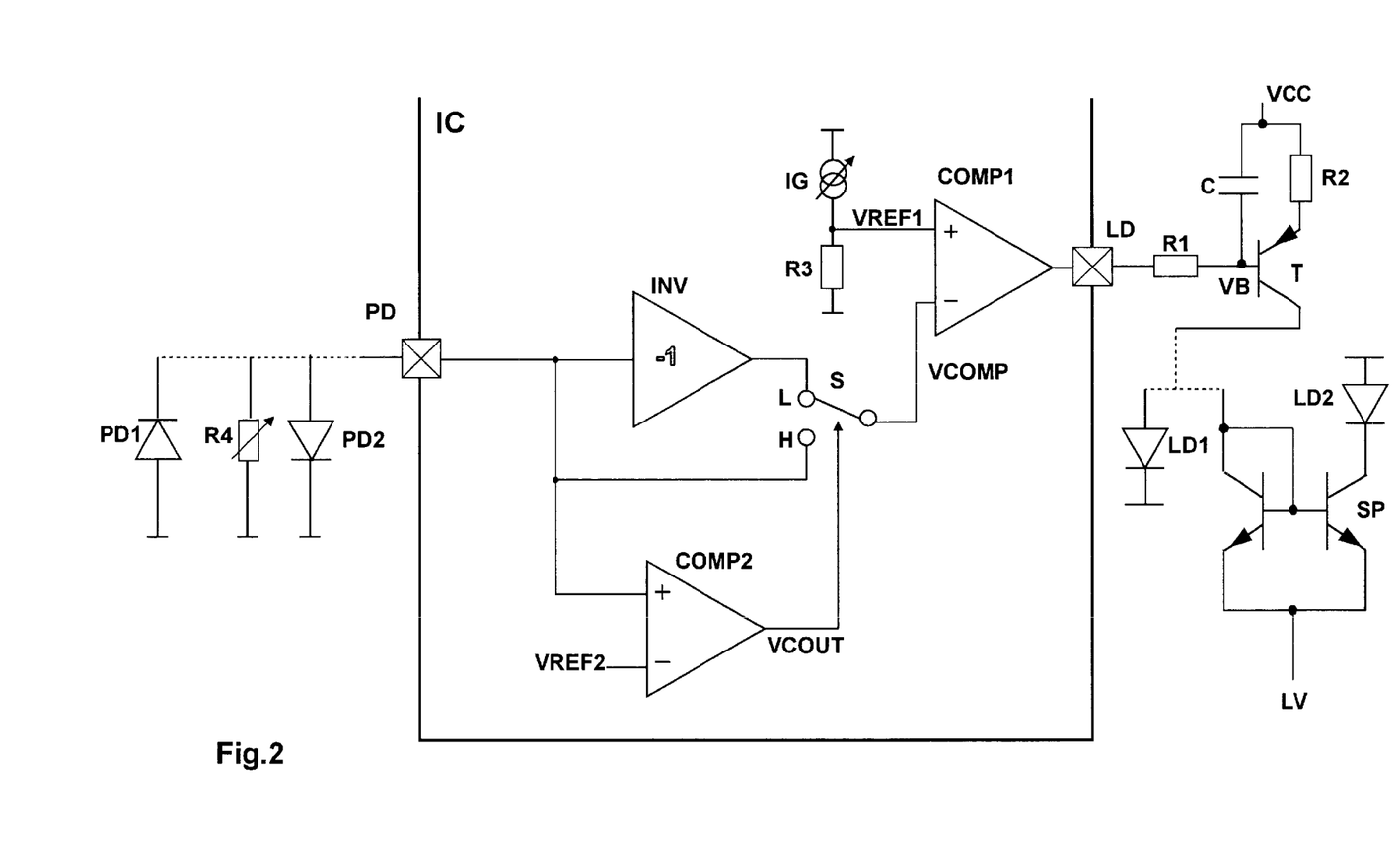
FIG. 2 shows a block diagram of the voltage-controlled design of a laser control loop with automatic adaptation to the monitoring signal polarity.
Figure 3:
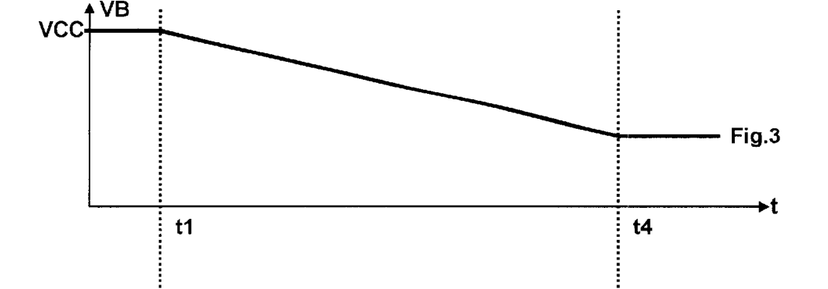
FIG. 3 shows a diagram of the temporal variation in the control voltage in relation to laser control for a positive monitoring signal.
Figure 4:
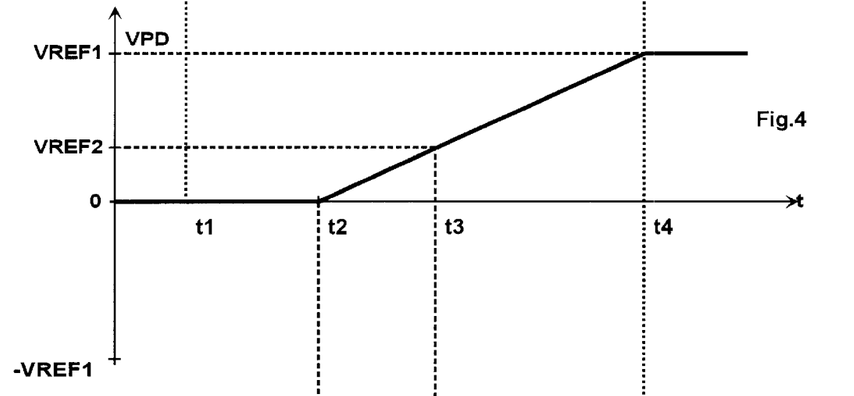
FIG. 4 shows a diagram of the temporal variation in a positive monitoring signal.
Figure 5:
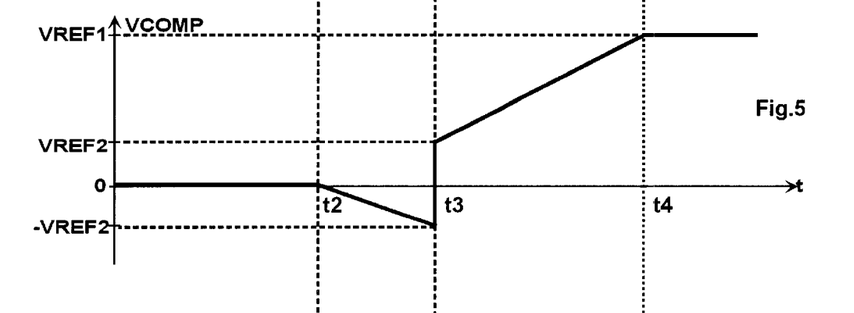
FIG. 5 shows a diagram of the temporal variation in the input voltage at the first comparator for a positive monitoring signal.
Figure 6:
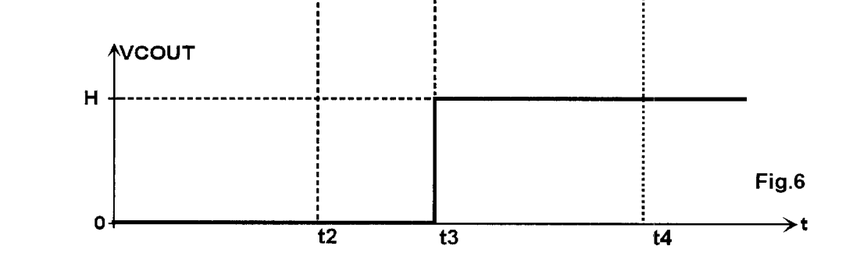
FIG. 6 shows a diagram of the temporal variation in the output voltage of the second comparator for a positive monitoring signal.
Figure 7:
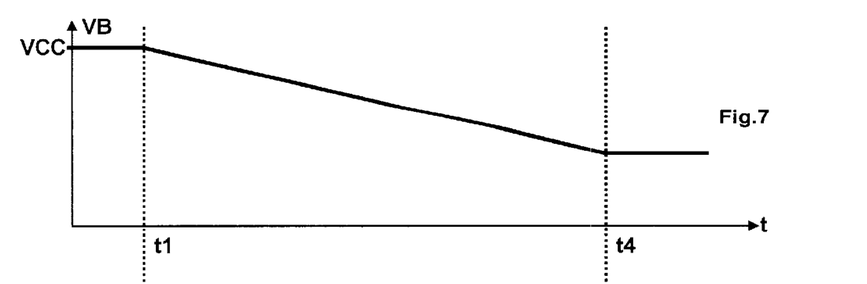
FIG. 7 shows a diagram of the temporal variation in the output voltage at the circuit for laser control with automatic adaptation to the monitoring signal polarity for a negative monitoring signal.
Figure 8:
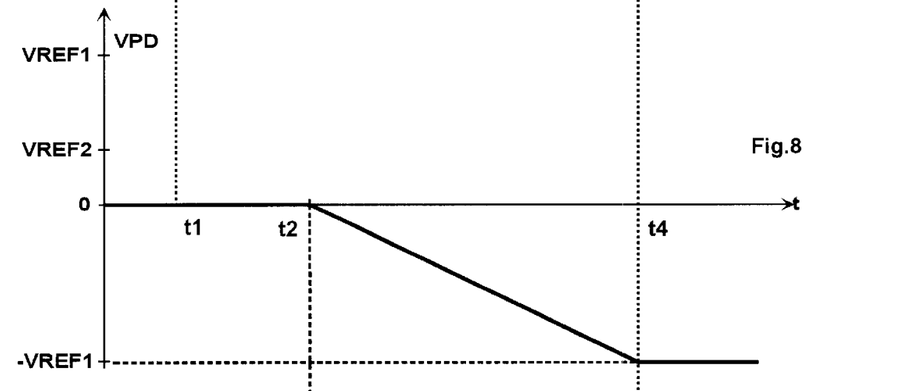
FIG. 8 shows a diagram of the temporal variation in a negative monitoring signal.
Figure 9:
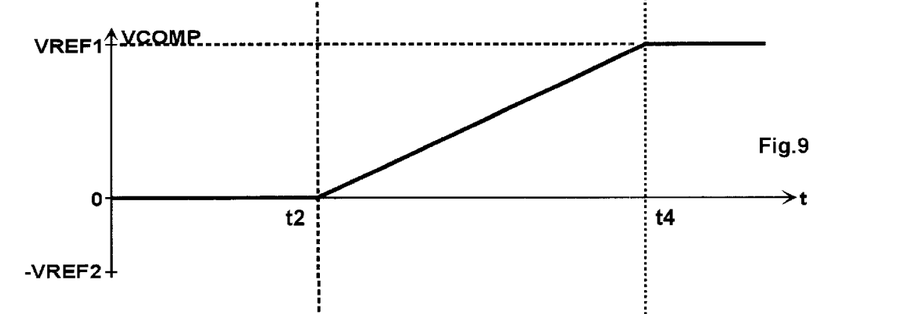
FIG. 9 shows a diagram of the temporal variation in the input voltage at the first comparator for a negative monitoring signal.
Figure 10:
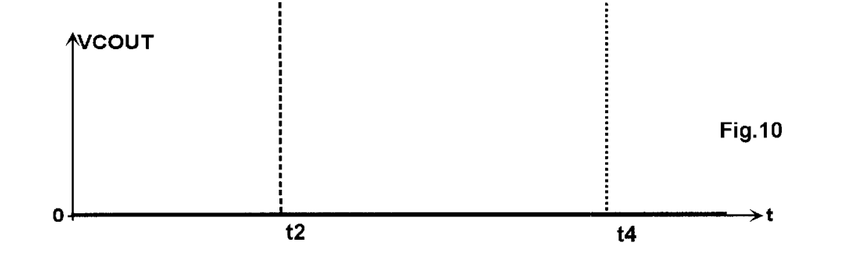
FIG. 10 shows a diagram of the temporal variation in the output voltage of the second comparator for a negative monitoring signal.
Figure 11:
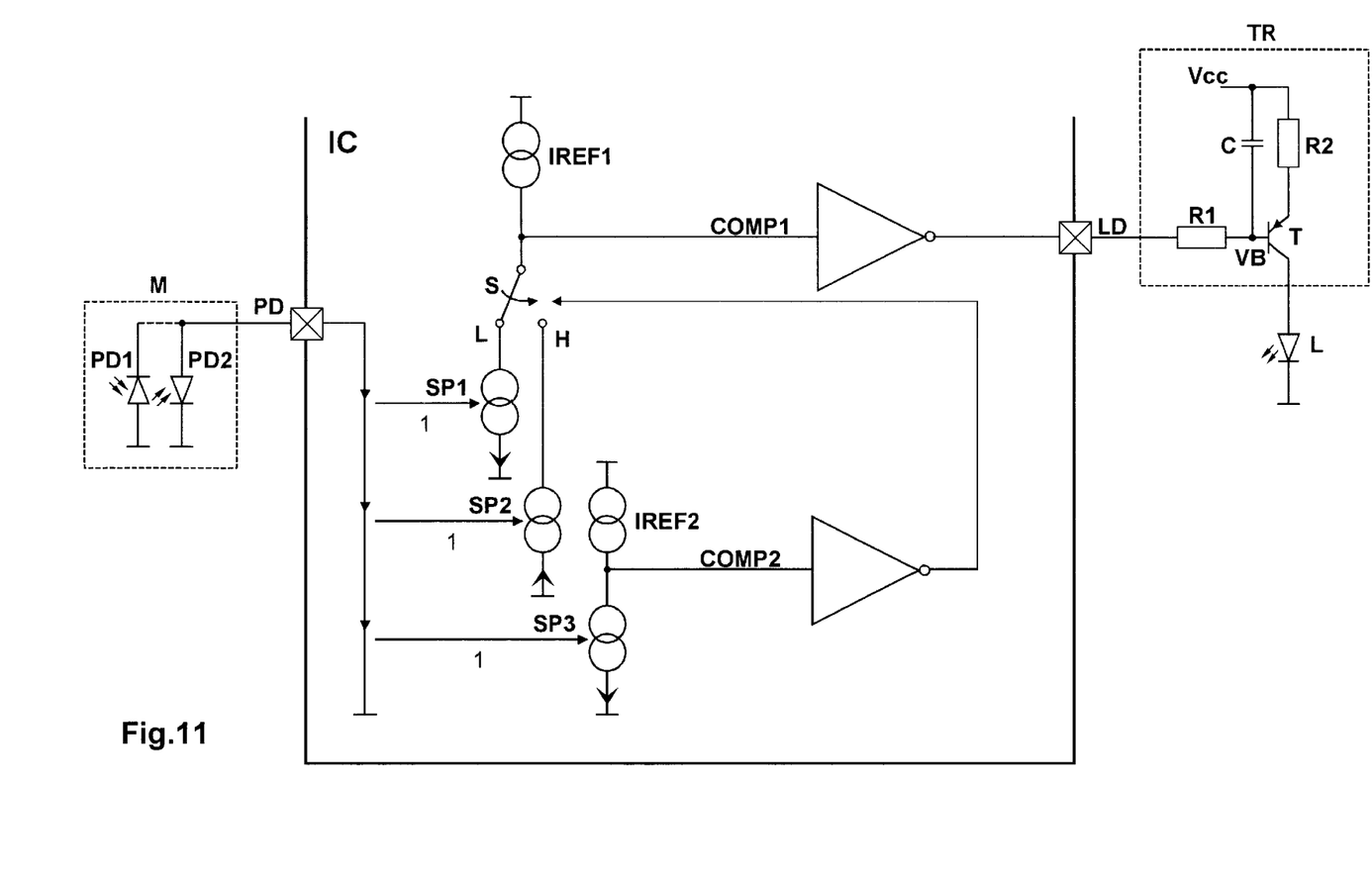
FIG. 11 shows a block diagram of the current-controlled design of a laser control loop with automatic adaptation to the monitoring signal polarity.

The block diagram, illustrated in FIG. 1, of a light power control loop with automatic adaptation to the monitoring signal polarity shows a monitor M to which, for the purpose of controlling the light power or light intensity of a light source L, at least a portion of this light power is fed. The monitor M is formed by a photodetector which, in accordance with the type and connection of the photodetector, produces a positive or negative monitoring signal with an absolute value which corresponds to the light power of the light source L. Illustrated in FIG. 1 in the block, shown by dashed lines, of the monitor M are two photodiodes PD1, PD2 which are intended to indicate by the connection of their anode or cathode to frame that the monitor M generates either a positive or a negative monitoring signal. The photodetector signal PD provided by the monitor M is fed to the input of the circuit IC for light power control with automatic adaptation to the monitoring signal polarity. This circuit IC, whose block diagram is given in FIG. 1 in the area delimited by a thicker line, has two comparators COMP1, COMP2, an inverter INV and a changeover switch S, which are connected in such a way that a photodetector signal PD connected at the input of the circuit IC is fed to the inverter INV, the second comparator COMP2 and a first terminal H of the changeover switch S. The output of the inverter INV is connected to a second terminal L of the changeover switch S. In order to connect the first terminal H or second terminal L of the changeover switch S to the input of the first comparator COMP1, the changeover switch S is controlled by the output of the second comparator COMP2. Interference from bouncing of the changeover switch S is avoided with the aid of switching hysteresis of the second comparator COMP2. The output of the first comparator COMP1 forms the output LD of the circuit IC, at which the control signal for switching on the light power of the light source L is provided. The light source L is fed by a driver TR which, as illustrated in FIG. 1, comprises as a rule a power transistor T, two resistors R1, R2 and a capacitor C. The power transistor T is preferably a pnp transistor whose base forms the input via the first resistor R1, and whose collector forms the output of the driver TR. The supply voltage VCC of the driver is fed to the base of the power transistor T via the capacitor C, and to the emitter of the power transistor T by the second resistor R2. The capacitor C of the driver TR is provided for starting the laser current and for stabilizing the control circuit against high frequencies. The block diagram illustrated in FIG. 1 shows the basic design of the light power control loop with automatic adaptation to the monitoring signal polarity which can, as illustrated in FIG. 2, be designed, for example, as a voltage-controlled laser control loop with automatic adaptation to the monitoring signal polarity or, as illustrated in FIG. 11, as a current-controlled laser control loop with automatic adaptation to the monitoring signal polarity. Moreover, FIG. 12 specifies a further embodiment as a voltage-controlled laser control loop with automatic adaptation to the monitoring signal polarity. The method implemented with the aid of the circuit arrangement is a single-phase method consisting in that a photodetector signal PD, which is produced by the monitor M during the starting phase of the current feeding the light source L, is compared with a second reference value REF2, and in accordance with the result of the comparison, the photodetector signal PD is fed during the starting phase of the current feeding the light source L to the first comparator COMP1 directly or in an inverted fashion in order to control the light power of the light source L. The reference values REF1 and REF2 are selected in such a way that the absolute value of the second reference value REF2 is smaller than that of the first reference value REF1. This method is explained below in more detail with the aid of the block diagram, illustrated in FIG. 2, of the voltage-controlled design of a laser control loop with automatic adaptation to the monitoring signal polarity, with the aid of diagrams illustrated in FIGS. 3 to 10. The comparators COMP1, COMP2 are formed in accordance with the design illustrated in FIG. 2 by difference amplifiers with voltage inputs. As is shown below, it is possible without changes to the circuit IC or prior determination of the polarity of the monitor diode to connect at the input of the circuit IC a monitor diode which is a photodiode PD1 with an anode connected to frame, or a photodiode PD2 with a cathode connected to frame. The circuit IC is independent of the polarity of the monitor diode, since this is detected automatically by the circuit IC in the starting phase of the laser current. As illustrated in FIG. 2, a laser diode LD1 connected to frame by the cathode, or else a laser diode LD2 connected to frame by the anode can be used as laser. In the case of a laser diode LD2 connected to frame by the anode, the laser diode LD2 is connected via a current mirror SP to the collector of the power transistor T, which forms the output of the driver circuit. A laser supply voltage LV is then provided for feeding the current mirror SP. Since the capacitor C of the driver circuit is completely discharged at the instant of switching on the laser control, at which point the supply voltage VCC is applied to the driver, the pnp power transistor T is blocked. The control voltage VB at the base of the pnp power transistor T corresponds to this instant of the supply voltage VCC. Thus, at the beginning of the starting phase, which is given as a starting instant t1 in the diagrams of FIGS. 3 and 4 and also 7 and 8, there is no voltage at the laser diode LD1 or LD2, and the driver circuit formed by the power transistor T drives a current into the output LD of the circuit IC, which is preferably a push-pull output of the first comparator COMP1. The capacitor C is charged with the current, and the power transistor T is turned on or conducting when a charging voltage of approximately 0.5 volt is reached. As a result, the laser diode LD1 or LD2 is fed current and the laser emits light. The light produced by the laser diode LD1 or LD2 is detected by one of the photodiodes PD1 or PD2, and a photodetector signal PD is produced. A voltage produced in this phase by the monitor diode or the photodiodes PD1, PD2 is relatively low, and the polarity of the monitor diode can be correspondingly positive or negative. Since a positive reference voltage VREF2 is provided at the reference input for the second comparator COMP2, in this design the output of the second comparator COMP2 is initially generally set to low. The changeover switch S is controlled independently of the monitoring signal polarity into a position in which the photodetector signal PD is fed to the first comparator COMP1 via the inverter INV. Irrespective of the polarity of the monitor diode, initially a signal path of the photodetector signal PD via the inverter INV to the first comparator COMP1 is always activated thereby in the starting phase. This instant corresponds to the instant t2 given in FIGS. 4 to 6 and 8 to 10. The photodetector signal PD given in FIGS. 4 and 8 as photodetector voltage VPD raises the polarity of the monitor diode correspondingly, and at an instant t3 reaches the absolute value of the second reference value REF2 which, in this exemplary embodiment, is formed by a second reference voltage VREF2 of positive polarity at the second comparator COMP2. If there is connected at the circuit IC a monitor diode with a polarity for which, as illustrated in FIG. 8, a negative photodetector voltage VPD is produced by the monitor diode as photodetector signal PD, the signal path in the circuit IC via the inverter INV is already correctly selected. The negative photodetector voltage VPD is converted by the inverter INV into a voltage VCOMP which is positive, and the positive voltage VCOMP is compared with the first reference voltage VREF1 of the first comparator COMP1. The first reference voltage VREF1 at the first comparator COMP1 constitutes the desired value for a light power which is to be set in the laser control loop. In the case of the design illustrated in FIG. 2, the reference voltage VREF1 is produced with the aid of a current source IG which operates on a resistor R3 and can be set by a microprocessor (not illustrated). When such a monitor diode is connected, as illustrated in FIG. 10, to the output of the second comparator COMP2, the latter carries an output voltage VCOUT corresponding to a low signal since, as illustrated in FIG. 8, the negative photodetector voltage VPD is always lower in this case than the second reference voltage VREF2 at the second comparator COMP2. The starting phase is ended when the positive voltage VCOMP, which is formed by the inverter INV from the negative photodetector voltage VPD, reaches the first reference voltage VREF1 applied to the first comparator COMP1. This corresponds to the instant t4 given in FIGS. 7 to 10. The control of the light power which sets in after the starting phase is then performed in a known way and is not further influenced by the method and the circuit arrangement for automatic adaptation to the monitoring signal polarity, since the signal path switched is retained up to the renewed switching on of the laser control loop. Illustrated in FIG. 7 is the control voltage VB which is based on the pnp power transistor T, decreases in the starting phase of the laser current and, at the instant t4 at the end of the starting phase, is the voltage with which the laser is controlled. The diagrams illustrated in FIGS. 7 to 10 therefore explain the temporal voltage variations for the case when there is connected at the circuit IC a monitor diode which provides a negative photodetector voltage VPD. As indicated in FIG. 2, there is provided as a rule parallel to the photodiode PD1 or PD2 a resistor R4 which is used to calibrate the sensitivity of the photodetector. The circuit arrangement reacts as follows if, by contrast with the abovementioned case, there is connected at the circuit IC a monitor diode which, as illustrated in FIG. 4, provides a positive photodetector voltage VPD. As already mentioned above, the circuit arrangement ensures in the starting phase at the instant t2 that a photodetector signal PD provided by the monitor diode is fed independently of its polarity at this instant t2 to the first comparator COMP1 via the inverter INV. The charging of the capacitor C causes more and more current to flow through the laser diode LD1 or LD2, thus increasing the light power emitted. At this instant t3, the positive monitor or photodetector voltage VPD reaches the second threshold value voltage VREF2 of the second comparator COMP2. When this occurs, the second comparator COMP2 switches its output to high H. The corresponding output voltage VCOUT of the second comparator COMP2 is illustrated in FIG. 6 for a positive monitor diode voltage. The output voltage VCOUT of the second comparator COMP2 sets the changeover switch S in such a way that the photodetector signal PD is fed directly to the first comparator COMP1. As illustrated in FIG. 5, this causes the polarity of the voltage VCOMP to change at the input of the first comparator COMP1, and correct laser control is ensured. Because of the fact that a monitor diode which is actually connected for the first comparator COMP1 with an appropriate polarity at the circuit IC is firstly connected via an inverter INV and thus with the wrong polarity for the first comparator COMP1, a circuit IC for laser control is created which can be used universally independently of the polarity of the monitor diode. There is no need for additional connection to a connection at the circuit IC, and there is also no delay, because by a preceding detection of polarity, in switching on the laser control loop. The polarity detection is carried out during the starting phase of the laser control loop in parallel with the starting phase. In order to ensure that the signal path in the circuit IC is switched in accordance with the polarity of the monitor diode before starting the laser control, it is necessary to use a second reference voltage VREF2 which is lower than the first reference voltage VREF1. The duration of the starting phase of the laser control loop is determined by the control current at the output LD of the circuit IC, and by the time constant formed with the capacitor C. As a rule, it is a few milliseconds, while only a few microseconds are required for the changeover operation in the circuit IC. The changeover switch S is preferably designed as an electronic switch, and it may be pointed out that the operations carried out by the electronic modules can also be executed by software. Moreover, FIG. II also gives a further embodiment of the invention, which consists in a current-controlled design of the laser control loop with automatic adaptation to the monitoring signal polarity. In accordance with this design, the circuit IC for laser control with automatic adaptation to the monitoring signal polarity is provided with currents which have a different direction and/or polarity in accordance with the polarity of the monitor diode or photodetector circuit used. Either the circuit IC is fed a current as photodetector signal PD, or a current corresponding to the detected light power is drawn from the circuit IC. In this design, as well, a laser control loop which is independent of the polarity of the signal of the monitor diode is formed with the aid of a circuit arrangement given in FIG. 11. For this purpose, the photodetector signal PD is fed to current mirrors SP1, SP2, SP3 provided in the circuit IC, two current mirrors SP1, SP2 being connected with opposite directions to a first reference current source IREF1 via a changeover switch S. The third current mirror SP3 is connected to a second reference current source IREF2. In a fashion similar to the abovenamed design, a second comparator COMP2, which controls the changeover switch S, is formed with the aid of an amplifier which is connected at the connecting point of the third current mirror SP3 with the second reference current source IREF2. In this design, the function of the inverter INV named in conjunction with the voltage-controlled design is implemented with the aid of the direction of the current mirror SP1. Consequently, the current mirror SP1 simultaneously takes over a function which inverts the photodetector signal PD. In a way similar to the abovementioned design, the second comparator COMP2 ensures that in the starting phase of the laser control loop the inverted photodetector signal PD is always fed independently of the current direction of the photodetector signal PD to the first comparator COMP1 initially or in the above-named period t2 to t3, as illustrated in FIG. 5 and FIG. 9. Only in the case when the photodetector signal PD exceeds the second reference current value IREF2, is the photodetector signal PD fed directly to the first comparator COMP1 by switching the changeover switch S. In accordance with FIG. 11, the first comparator COMP1 is formed by an amplifier which is connected to the first reference current source IREF1 and the changeover switch S, and whose output is the output LD of the circuit IC. The temporal signal variations are identical to the diagrams illustrated in FIGS. 3 to 10.

Figure 12:
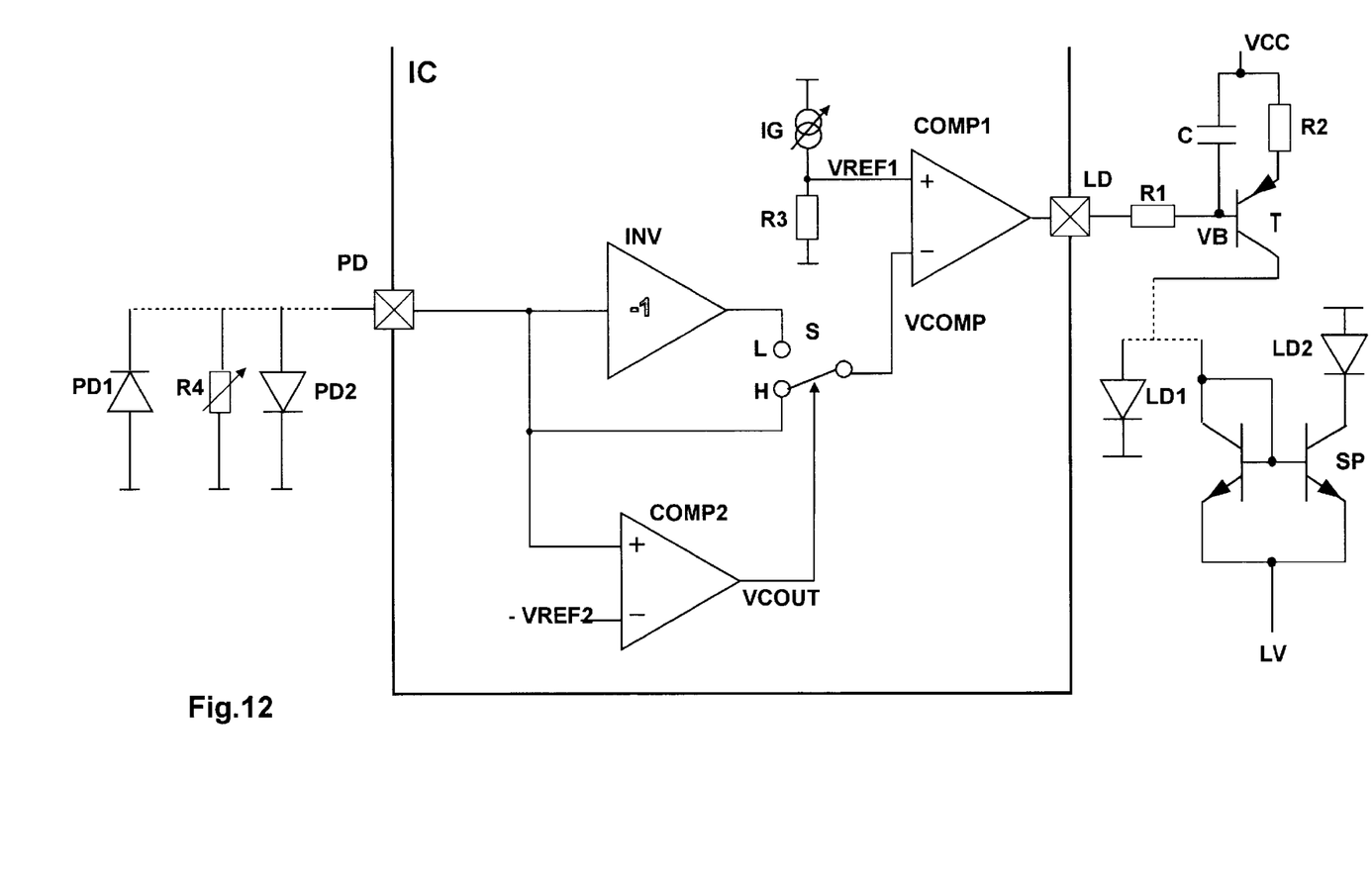
FIG. 12 shows a block diagram of the voltage-controlled design of a laser control loop with automatic adaptation to the monitoring signal polarity with initially dominating direct monitoring signal feed.
Figure 13:
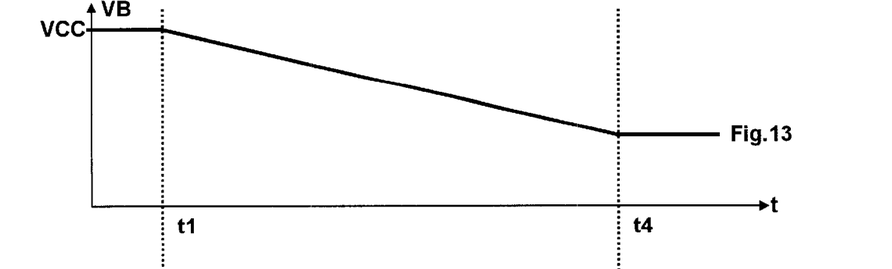
FIG. 13 shows a diagram of the temporal variation in the control voltage for laser control for a positive monitoring signal.
Figure 14:
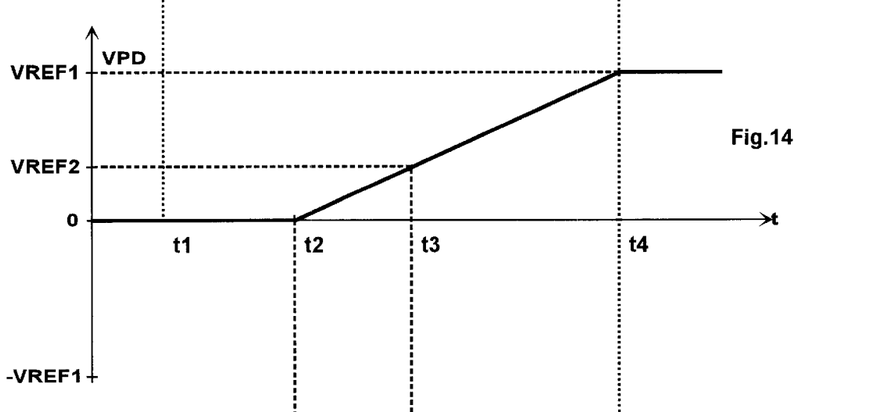
FIG. 14 shows a diagram of the temporal variation in a positive monitoring signal.
Figure 15:
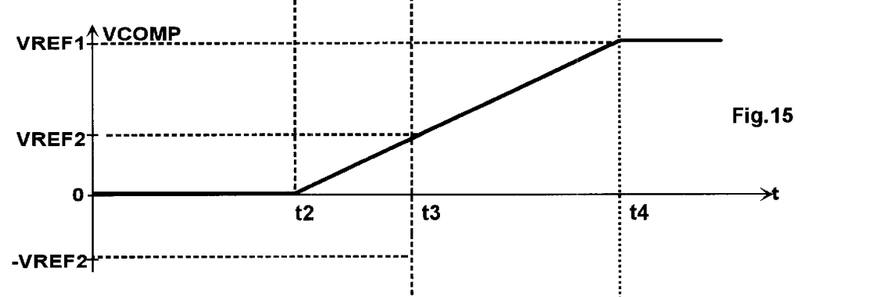
FIG. 15 shows a diagram of the temporal variation in the input voltage at the first comparator for positive monitoring signal.
Figure 16:
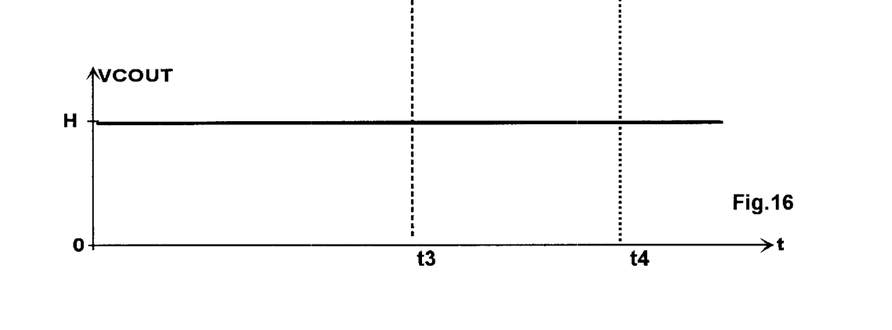
FIG. 16 shows a diagram of the temporal variation in the output voltage of the second comparator for a positive monitoring signal with initially dominating direct monitoring signal feed.
Figure 17:
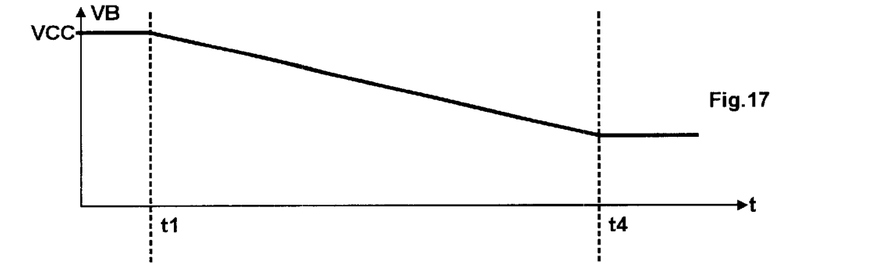
FIG. 17 shows a diagram of the temporal variation in the control voltage for laser control for a negative monitoring signal.
Figure 18:
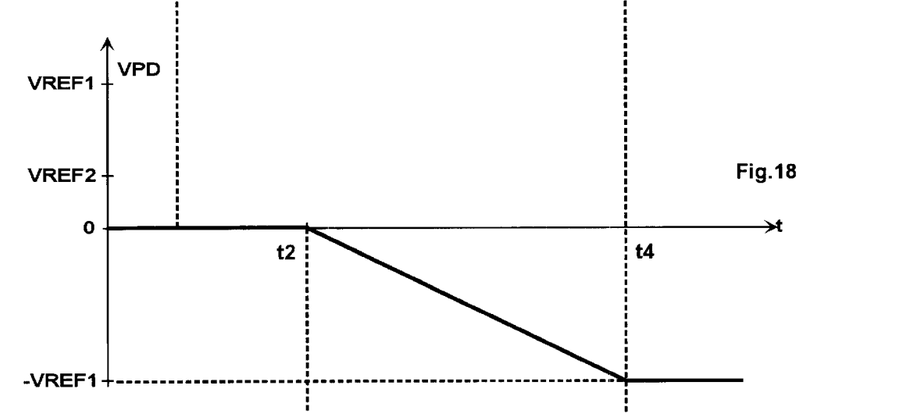
FIG. 18 shows a diagram of the temporal variation in the negative monitoring signal.
Figure 19:
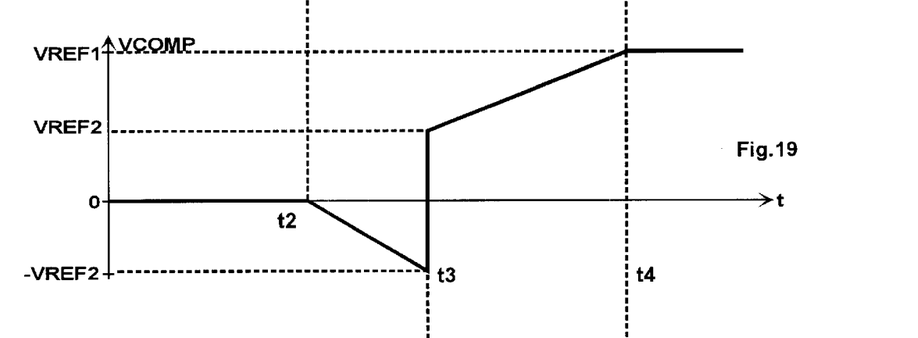
FIG. 19 shows a diagram of the temporal variation in the input voltage at the first comparator for a negative monitoring signal.
Figure 20:
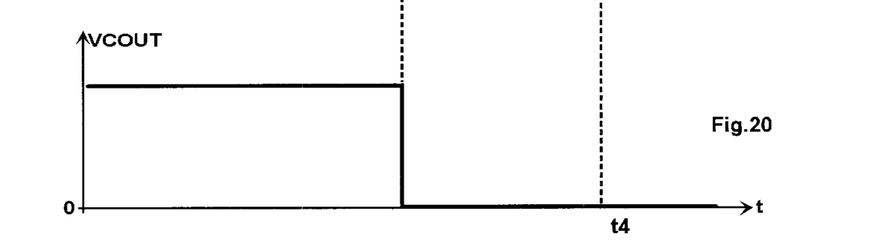
FIG. 20 shows a diagram of the temporal variation in the output voltage of the second comparator for a negative monitoring signal with initially dominating direct monitoring signal feed.

Whereas with the abovementioned exemplary embodiments the monitoring signal was initially always fed in the starting phase in an inverted fashion at the first comparator COMP1, FIG. 12 gives a circuit arrangement in which initially a direct feed of the monitoring signal always dominates. This is achieved by providing a reference voltage −VREF2 of negative polarity at the second comparator COMP2. FIG. 12 is identical to FIG. 2 with regard to all the other constituents. The corresponding signal variations are illustrated in FIGS. 13 to 20. The result of using a negative second reference voltage −VREF2 is that in the starting phase of the laser control loop the first comparator COMP1 is fed a monitoring signal which accords with the polarity of the monitoring signal. If the monitoring signal has a polarity leading to the fact that the rise in the signal, as illustrated in FIG. 19, in the starting phase is not aligned to run up to the first reference voltage VREF1, this is detected by the second comparator COMP2, and the inverter INV is inserted into the signal path to the first comparator COMP1. With this design, as well, a laser control loop is created which is independent of the polarity of the monitoring signal and has no delay in the starting phase.

The embodiments described here are given only as examples, and a person skilled in the art can implement other embodiments of the invention which remain within the field of the invention.

What is claimed is:

1. Method for controlling a laser control loop to provide automatic adaptation to a polarity of a monitoring signal, comprising the steps of:

receiving a monitoring signal during a starting phase of the laser control loop, the starting phase including a period from the application of a supply voltage to a driver of a laser to when light power of the laser is to be controlled;

comparing the monitoring signal with a second reference value in a second comparator;

providing either the monitoring signal or an inverted monitoring signal to a first comparator in response to the output of the second comparator; and comparing the monitoring signal or the inverted monitoring signal with a first reference value in the first comparator and controlling the light power of the laser in response to the output of the first comparator for automatically adapting the laser control loop to the monitoring signal polarity during the starting phase of the laser control loop.

2. Method according to claim 1, wherein said monitoring signal produced during the starting phase of the laser control loop is compared with a second reference value in a second comparator, and the monitoring signal is fed directly or inverted in accordance with the result of the comparison to the first comparator for controlling the light power of the laser in a fashion independent of the monitoring signal polarity.

3. Method according to claim 1, further comprising the step of producing, at the second comparator, a signal which initially feeds to the first comparator the inverted monitoring signal in a fashion always independent of the monitoring signal polarity, and then feeds it in a non-inverted fashion if the monitoring signal runs up to the first reference value.

4. Method according to claim 1, wherein the second reference value is smaller than the first reference value.

5. Circuit arrangement for a laser control loop, comprising:

a photodetector providing a monitoring signal having a signal polarity;

a second comparator coupled to the photodetector and responsive to said monitoring signal for detecting the monitoring signal polarity by comparing the monitoring signal with a second reference value, which is smaller than a first reference value, for controlling the light power of the laser during a starting phase of the laser control loop, when a supply voltage is applied to a driver of the laser;

an inverter for inverting the polarity of the monitoring signal; and a first comparator for comparing the monitoring signal directly or via said inverter in response to the monitoring signal polarity detected by said second comparator with said first reference value, the light power of the laser being controlled in response to an output of the first comparator.

6. Circuit arrangement according to claim 5, wherein the second comparator is connected to a control input of a changeover switch at which the first comparator is connected at the photodetector or via an inverter at the photodetector.

7. Circuit arrangement according to claim 6, wherein the changeover switch is an electronic switch.

8. Circuit arrangement according to claim 5, wherein during the starting phase of the laser control loop the first comparator is always connected via an inverter to the monitor or is always connected directly to the monitor in a fashion corresponding to the polarity of the reference signal appled at the second comparator.

9. Circuit arrangement according to claim 5, wherein the second comparator is a difference amplifier.

10. Circuit arrangement according to claim 5, wherein the second comparator is a current mirror connected to a second reference current source.

* * * * *